(12) United States Patent
Garrett et al.

(10) Patent No.: US 9,030,333 B2
(45) Date of Patent: May 12, 2015

(54) ADVANCED METERING INFRASTRUCTURE NETWORK VISUALIZATION

(75) Inventors: Joseph John Garrett, Munford, AL (US); Brandon Keith Lundy, Birmingham, AL (US); Derl Wayne Rhoades, Gardendale, AL (US)

(73) Assignee: Southern Company Services, Inc., Atlanta, GA (US)

( * ) Notice: Subject to any disclaimer, the term of this patent is extended or adjusted under 35 U.S.C. 154(b) by 1051 days.

(21) Appl. No.: 12/908,499

(22) Filed: Oct. 20, 2010

(65) Prior Publication Data

US 2012/0101749 A1  Apr. 26, 2012

(51) Int. Cl.
 *G08B 23/00* (2006.01)
 *G01R 22/06* (2006.01)
 *G01R 22/10* (2006.01)

(52) U.S. Cl.
 CPC .............. *G01R 22/063* (2013.01); *G01R 22/10* (2013.01); *Y02B 90/246* (2013.01); *Y04S 20/42* (2013.01); *Y04S 20/46* (2013.01)

(58) Field of Classification Search
 CPC ..................................................... G01R 22/10
 USPC ........................................ 340/870.01, 870.02
 See application file for complete search history.

(56) References Cited

U.S. PATENT DOCUMENTS

| | | | | |
|---|---|---|---|---|
| 5,568,399 | A * | 10/1996 | Sumic | 700/293 |
| 6,259,972 | B1 * | 7/2001 | Sumic et al. | 700/286 |
| 7,889,094 | B2 * | 2/2011 | Gilbert et al. | 340/815.45 |
| 8,121,741 | B2 * | 2/2012 | Taft et al. | 700/295 |
| 2004/0236620 | A1 * | 11/2004 | Chauhan et al. | 705/9 |
| 2006/0242323 | A1 * | 10/2006 | Sanderford et al. | 709/245 |
| 2007/0183369 | A1 * | 8/2007 | Angelis | 370/332 |
| 2008/0154802 | A1 * | 6/2008 | Chalupsky et al. | 705/412 |
| 2009/0000302 | A1 * | 1/2009 | Edwards et al. | 60/698 |
| 2009/0030712 | A1 * | 1/2009 | Bogolea et al. | 705/1 |
| 2009/0309749 | A1 * | 12/2009 | Gilbert et al. | 340/815.45 |
| 2010/0117856 | A1 * | 5/2010 | Sonderegger | 340/870.02 |
| 2010/0278187 | A1 * | 11/2010 | Hart et al. | 370/401 |

* cited by examiner

*Primary Examiner* — Amine Benlagsir
(74) *Attorney, Agent, or Firm* — Thomas|Horstemeyer, LLP

(57) ABSTRACT

Systems and methods for visualization of Advanced Metering Infrastructure (AMI) deployments are disclosed. A status associated with communications towers or metering devices in an AMI deployment can be monitored based on alarms generated by a metering vendor system or based on thresholds specified in the AMI operations database. A user interface can be generated that allows the AMI deployment to be visualized, with status indicators associated with statuses overlaid on a map. The user interface can further facilitate visualization of progress of tasks associated with AMI operations.

24 Claims, 7 Drawing Sheets

ADVANCED METERING INFRASTRUCTURE NETWORK VISUALIZATION

BACKGROUND

Advanced Metering Infrastructure (AMI) deployments are increasing in prevalence because the AMI deployments can reduce labor costs as well as increase billing efficiency relative to other utility metering deployments. As more AMI metering devices are employed, the amount of data that must be managed increases accordingly. Therefore, understanding at a high level the status of an AMI deployment can become increasingly difficult as additional AMI metering devices are added to a deployment, and as the geographic breadth of a deployment increases.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the disclosure. Moreover, in the drawings, like reference numerals designate corresponding parts throughout the several views.

DETAILED DESCRIPTION

Figure 1:
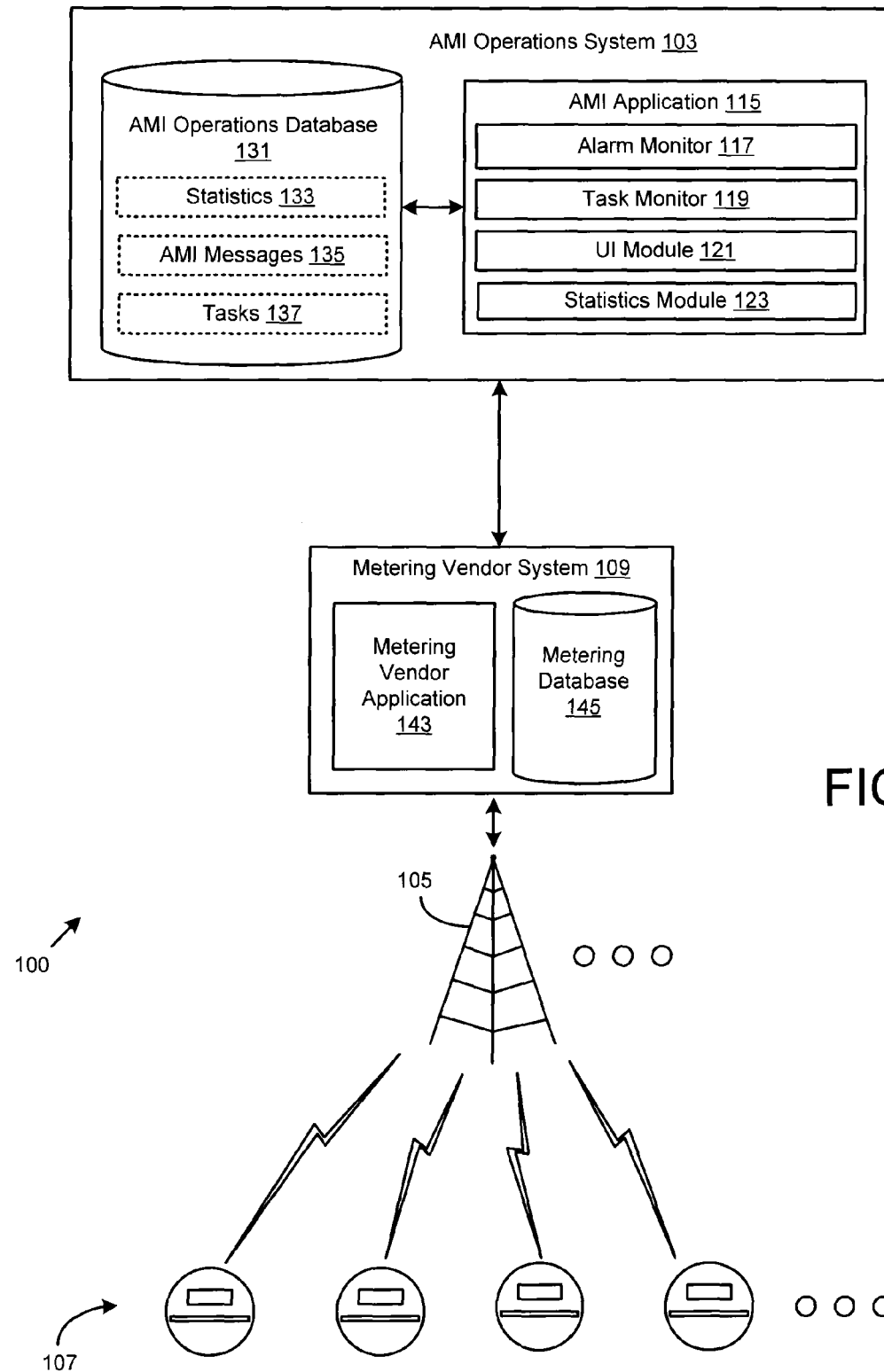
FIG. 1 is a drawing of an AMI deployment according to various embodiments of the present disclosure.

With reference to FIG. 1, shown is an AMI utility metering environment 100 according to various embodiments. The utility metering environment 100 includes an AMI operations system 103 in communication with a metering infrastructure. The metering infrastructure can, in one non-limiting embodiment, include one or more communications towers 105 or tower gateway base stations (TGB) that can receive utility usage information from a fleet of utility metering devices 107 that are deployed at various customer premises. Additionally, a metering vendor facilitating deployment of an AMI utility metering environment often provides a regional network interface (RNI), or a metering vendor system 109, which interfaces with the various communications towers 105 in a deployment to collect usage data, alarm messages, and other statistics, values and metrics that can originate from the metering devices 107 and/or the communications towers 105.

The AMI operations system 103 and metering vendor system 109 may comprise, for example, a computing device, a server computer or any other system providing computing capability or resources. Alternatively, a plurality of computing devices may be employed that are arranged, for example, in one or more server banks or computer banks or other arrangements. For example, a plurality of computing devices together may comprise, for example, a cloud computing resource, a grid computing resource, and/or any other distributed computing arrangement. Such computing devices may be located in a single installation or may be distributed among many different geographical locations. Additionally, some components executed on a computing device can be executed in one installation, while other components can be executed in another installation. For purposes of convenience, the computing device is referred to herein in the singular. Even though the computing device is referred to in the singular, it is understood that a plurality of computing devices may be employed in the various arrangements as described above.

The communications towers 105 can be configured to receive usage data, alarm messages, or other information from utility metering devices 107 deployed in an AMI deployment. As should be appreciated, utility metering devices 107 can be configured to provide one-way communication or two-way communication to report usage data associated with a meter, status information, alarm messages, and other administrative data. Additionally, in two way systems, administrative information or various commands that can cause a utility metering device 107 to take some course of action can be transmitted to the utility metering devices 107 via a communications tower 105. As one example, the AMI operations system 103 and/or metering vendor system 109 can transmit a command via the communications towers 105 causing a utility metering device 107 to report usage data. It should further be appreciated that a utility metering device 107 can also interact with any system (e.g., a computing device, a metering collection device, a vehicle mounted metering collection device, a mobile collector, a local area fixed collector, etc.) complying with a communications protocol specified by the metering infrastructure, regardless of whether such a system is transmitting data and/or messages via the depicted communications towers 105.

The utility metering devices 107 can, in some embodiments, transmit and/or receive data wirelessly to and from the depicted metering vendor system 109 via one or more communications towers 105. In one embodiment, metering devices 107 can communicate with the metering vendor system 109 via wireless messages in a proprietary or non-proprietary format in licensed or unlicensed wireless spectrum. In other embodiments, the metering vendor system 109 can communicate with the metering vendor system 109 via standardized cellular communications technology such as, but not limited to, GPRS, CDMA, and other technologies as can be appreciated.

Various applications and/or other functionality may be executed in the AMI operations system 103 according to various embodiments. In the depicted non-limiting embodiment, the meter AMI operations system 103 can execute an AMI application 115 that can include various modules that facilitate the functionality described herein. It should be appreciated that the depicted arrangement of an AMI application 115 executing various modules is but one non-limiting example of an arrangement of an embodiment of the disclosure given for ease of depiction as well as discussion herein. It should also be appreciated that embodiments of the disclosure can be implemented in various ways.

The AMI application 115 can execute an alarm monitor 117 that monitors messages received from one or more communications towers 105 and/or metering devices 107 in an AMI deployment and generates an alarm that can allow issues or problems to be detected or monitored as will be further described herein. The task monitor 119 is executed to identify and monitor various tasks associated with an AMI deployment so that AMI operations personnel can keep abreast of tasks necessary or desired for the deployment. One example of such a task is retrieval of usage data from a subset of the metering devices 107 in an AMI deployment that may be requested by a billing system. Accordingly, the task monitor 119 can monitor the progress associated with such a task and determine whether the task is scheduled to be completed on time. The AMI application 115 can also execute a UI module 121 that can generate an administrative user interface, allowing utility operations personnel to visualize the status of an AMI deployment as well as monitor task progress. The statistics module 123 can receive messages from the metering vendor system 109 and/or communications towers 105 and metering devices 107 in an AMI deployment can calculate various statistics or monitor thresholds that can displayed in an administrative user interface, as will be described in further detail herein.

The metering vendor system 109 is often provided by vendors of equipment in an AMI deployment to facilitate interactions with communications towers 105 and/or utility metering devices 107. Accordingly, the metering vendor system 109 can include a metering vendor application 143 with which the AMI operations system 103 can interact as well as a metering database 145 that stores messages received from one or more communications towers 105 and/or metering devices 107 in the AMI deployment. In some embodiments, the AMI operations system 103 can interact directly with a metering database 145 maintained by the metering vendor system 109. The metering vendor system 109 can receive messages and/or alarms from communications towers 105 that correspond to a status of the communications towers 105 as well as status or usage data from the metering devices 107 in a deployment. In many metering vendor systems 109, the system does not to provide sufficient alarm monitoring or statistical information from which alarms or other alerts desired by a utility can be generated. Additionally, the metering database 145 often does not to maintain a complete archive of messages received from various devices in a deployment. As a result, the metering vendor system 109 often does not maintain statistics on which thresholds can be set to gain a better understanding of the status of an AMI deployment. Accordingly, the AMI operations system 103 can provide additional insight into the status of an AMI deployment over and above that which is provided by the metering vendor system 109.

The data stored in the AMI operations database 131 includes, for example, a statistics table 133, AMI messages 135, and tasks 137, and potentially other data. The statistics table 133 can include statistics specified by an operator of an AMI deployment that can be maintained in the AMI operations database 131. In one embodiment the statistics table 133 can include various statistics for each communications tower 105 in an AMI deployment. In other embodiments, the statistics table 133 can include statistics for various regions or service areas associated with a utility operator. The statistics table 133 can also specify thresholds in which a particular statistic in the statistics table 133 should be maintained. If a particular threshold is violated, the AMI application 115 can generate an alert or update a status associated with a communications tower 105 and/or metering devices 107 associated with the statistic.

One non-limiting example of a statistic that can be maintained in the statistics table 133 is an average signal strength associated with communications between a communications tower 105 and metering devices 107 with which it is communicating. In the context of this disclosure, signal strength can be measured as a signal to noise ratio or other measures of signal strength that can be appreciated. Additionally, embodiments of this disclosure can employ a measure of signal quality other than signal strength in order to develop a zone of interest and locate an unauthorized metering device. As some non-limiting examples, a bit error rate, jitter benchmarks, or other measures of signal quality as can be appreciated can be employed.

Another non-limiting example of a statistic that can be maintained in the statistics table 133 is an average number of messages per hour received by a communications tower 105. As another example, the statistics table 133 can maintain an average number of "buddy" messages, or peer-to-peer messages, received by a communications tower 105 per a unit of time. In such an example, an average number of buddy messages received per hour can indicate whether a communications tower 105 may be undergoing distress of some kind, as an average number of buddy messages per unit of time above a certain threshold can indicate that a communications tower 105 is having trouble acknowledging receipt of a message. As yet another non-limiting example of a statistic maintained in the statistics table 133 is a number of messages received per frequency slot in a communications tower 105 per a unit of time.

The AMI operations database 131 can also include one or more AMI messages table 135, which can store information regarding messages received by one or more communications tower 105 in an AMI deployment for historical and analysis purposes. Additionally, the AMI messages table 135 can also store each of the messages generated by a communications tower 105 and transmitted to the metering vendor system 109. The AMI operations database 131 can additionally include a tasks table 137 that specifies information about various tasks for which the AMI application 115 can monitor progress to determine whether the tasks will be completed when the task is due. Some examples of tasks the AMI application 115 can monitor include a request to retrieve usage data associated with a plurality of metering devices in the AMI deployment, a request to reconcile requested usage data and reported usage data associated with a plurality of metering devices in the AMI deployment, and a request to report usage data associated with a plurality of metering devices in the AMI deployment. Other examples of tasks should be appreciated by a person of ordinary skill in the art.

Other structures of the AMI operations database 131 can be employed that are consistent with this disclosure. As one example, tower specific data as well as meter specific data can be stored in various data store table structures that vary from the depicted example. Additionally, the AMI operations database 131 can be implemented in a separate installation from a computing device in which the AMI application 115 is executed. The AMI operations database 131 can also be implemented in a bank of server computing devices for scalability and data redundancy purposes. The depicted AMI operations database 131 shown in FIG. 1 is given for ease of depiction and discussion of the various embodiments of the present disclosure and is but one example.

Now, having generally described the various components in the AMI utility metering environment 100, description of operation of the AMI application 115 will be described. As described above, the AMI application 115 can, in one embodiment, execute various modules that provide varying functionality. The statistics module 123 can receive messages from the metering vendor system 109 that correspond to messages received from a communications tower 105 and/or metering device 107 and calculate statistics specified by the statistics table 133. The statistics module 123 can also update statistics stored in the statistics table 133 that are of interest to the operation of an AMI deployment. The statistics module 123 can initially store any message received from the metering vendor system 109 in the AMI messages table 135.

In some embodiments, the statistics module 123 can calculate a running average of various statistics that are of interest to operations of an AMI deployment. For example, the statistics module 123 can monitor the amount of messages received per a unit of time from metering devices 107 in a communications tower 105 and update such a running average. If the statistic changes by an amount over a threshold specified and defined in the statistics table 133, the statistics module 123 can alert utility personnel or another system, application or module that can address such a scenario. As another example, the statistics module 123 can calculate a running average of the average radio frequency (RF) noise observed by a communications tower 105 across the various metering devices 107 with which it communicates. Accordingly, a threshold can be defined in the statistics table 133 that specifies that if the RF noise associated with a communications tower 105 exceeds a threshold or changes by more than a specified amount, that an alert of some kind should be generated.

Additionally, the statistics module 123 can also validate messages received from the metering vendor system 109 to determine whether a communications tower 105 and/or metering device 107 are in a normal operational state. Therefore, as one example, the statistics module 123 can determine that if a communications tower 105 in communication with the metering vendor system 109 is not in a normal operational state, that one or more of the statistics (e.g., a running average signal strength between a communications tower and metering devices) in the statistics table 133 should not be updated. In such a scenario, the statistics module 123 can generate an alert that the communications tower 105 is not in a normal state. As another non-limiting example, the statistics module 123 can determine that if a given communications tower 105 has not transmitted any messages to the metering vendor system 109 beyond a certain time window, that there may be a catastrophic failure associated with the communications tower 105. Accordingly, the statistics module 123 can generate an alert in such a scenario.

The metering vendor system 109 can generate certain alarms regarding the status of the communications towers 105 and/or metering devices 107 in an AMI deployment that are not based on statistics that are calculated by the statistics module 123. The alarm monitor 117 can receive alarms generated by the metering vendor system 109 and update a status associated with a communications tower 105 and/or metering device 107 with which the alarm is associated. As one example of an alarm generated by the metering vendor system 109, a communications tower 105 can generate a door tamper alarm if the communications tower 105 detects unauthorized entry or tampering, and transmit the alarm to the metering vendor system 109. Accordingly, the metering vendor system 109 can transmit such an alarm to the alarm monitor 117, which can generate an alert or update a status associated with the communications tower 105.

Additional examples of alarms that can be generated by a communications tower 105, a metering device 107 and/or the metering vendor system 109 include a power failure alarm if a communications tower 105 and/or a metering device 107 reports a loss of power. A communications tower 105 or the metering vendor system 109 can generate a slot error alarm if one or both detect an error receiving wireless messages from metering devices 107 in an AMI deployment on a particular frequency slot. A communications tower 105 can generate a low battery alarm if a backup battery associated with the communications tower 105 is lower than a threshold battery level. A communications tower 105 and/or the metering vendor system 109 can generate a communication error alarm if the metering vendor system 109 cannot communicate with a communications tower 105. Additionally, a communications tower 105 and/or a metering device 107 in the AMI deployment can generate temperature error alarm if a temperature sensor detects a temperature outside a specified threshold. Additionally variations and alarms that can be generated by a communications tower and/or a metering device 107 in an AMI deployment should be appreciated.

The task monitor 119 can monitor various tasks associated with operation of an AMI deployment that can be defined in the tasks table 137 of the AMI operations database 131. The task monitor 119 can determine whether a particular task that is scheduled for completion in the near future has been completed, is nearing completion, is in danger of being overdue or has already become overdue. Accordingly, the task monitor 119 can alert operations personnel or other system or applications that can remediate a delinquent or delayed task. The task monitor 119 can monitor progress associated with another application designated to carry out a particular task, monitor time stamps associated with files in various file systems and/or monitor the existence of certain files in various file systems.

One example of a task that can be monitored by the task monitor includes a request to retrieve usage data for billing purposes associated with a plurality of metering devices 107 in the AMI deployment. In one embodiment, the task monitor 119 can monitor progress reported by an application or process tasked to retrieve usage data associated with various metering devices 107. The task monitor 119 can monitor a request to reconcile requested usage data and reported usage data associated with a plurality of metering devices in the AMI deployment. In another embodiment, the task monitor 119 can monitor a request to report usage data associated with a plurality of metering devices 107 in the AMI deployment. Other examples of tasks that can be monitored by the task monitor 119 should be appreciated by a person of ordinary skill in the art.

The user interface (UI) module 121 can interact with the alarm monitor 117, the task monitor 119 and the statistics module 123 to generate an administrative user interface that can visualize the status of an AMI deployment as well as monitor tasks associated with operations of the deployment. Accordingly, the UI module 121 can monitor alarms, alerts, statistics, and information about tasks generated by the AMI application 115 components to generate a user interface. Additionally, the UI module 121 can generate a map interface that allows this information to be overlaid on a map, as the location of the various communications towers 105 and/or metering devices 107 in a deployment is known or can be determined. The UI module 121 and an example user interface generated by the UI module 121 are discussed in further detail herein with reference to FIGS. 3-4.

Figure 2:
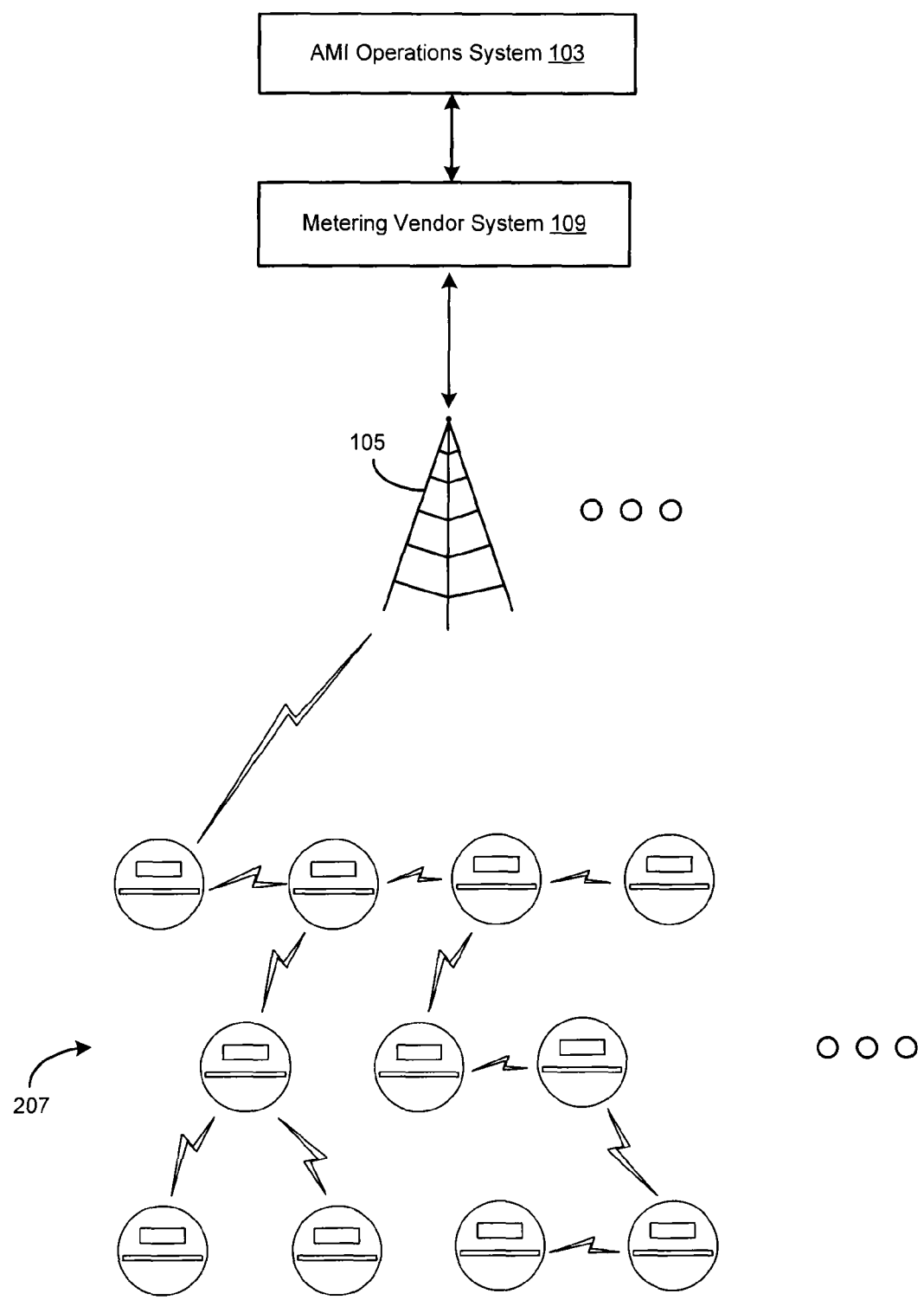
FIG. 2 is a drawing of an alternative AMI deployment according to various embodiments of the present disclosure.

Reference is now made to FIG. 2, which depicts an alternative example of an AMI deployment that includes utility metering devices 207 arranged in a mesh or a partial mesh network where each node (e.g. the utility metering devices) in the network is capable of acting as an independent router. The arrangement of utility metering devices 207 in a mesh network is increasingly employed in AMI deployments so that the number and expense of communications towers 105 can be reduced. To this end, the various utility metering devices 207 in the depicted example can communicate with other metering devices and act as a repeater whereby messages received from another utility metering device in the deployment repeat messages, such as utility usage data, that are received from other metering devices. In this way, data from utility metering devices 207 in the deployment can hop from meter to meter until the data reaches a utility metering device 207 that is within range of a communications tower 105, which can forward data to the meter metering vendor system 109.

Figure 3:
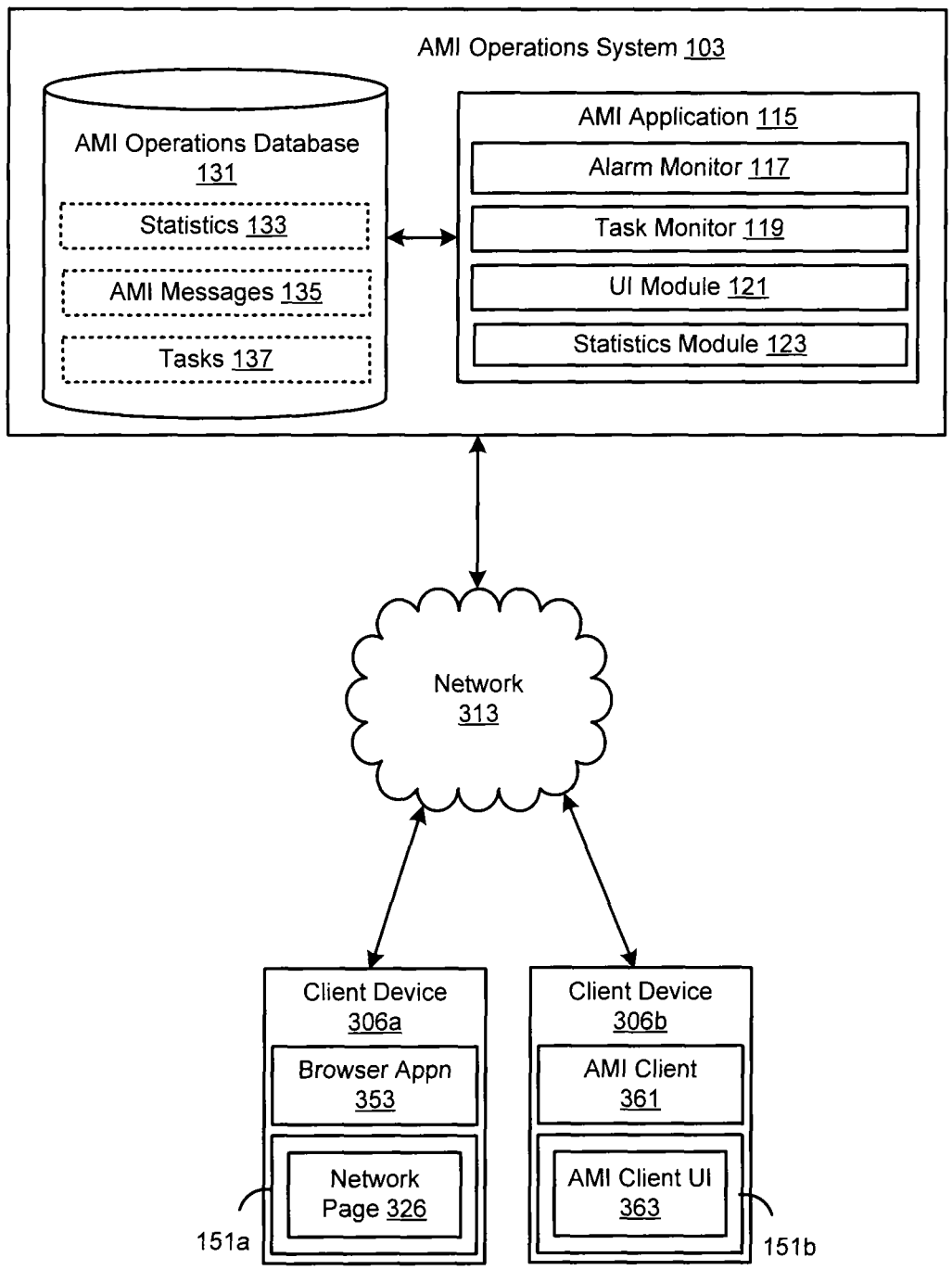
FIG. 3 is a drawing of the AMI operations system of FIG. 1 in communication with one or more clients according to various embodiments of the present disclosure.

Reference is now made to FIG. 3, which depicts at least one client device 306a, 306b in communication with the AMI operations system 103. A client device 306a, 306b can be coupled to the network 313 in order to communicate with the UI module 121 to view an administrative user interface as noted above. The network 313 includes, for example, the Internet, intranets, extranets, wide area networks (WANs), local area networks (LANs), wired networks, wireless networks, or other suitable networks, etc., or any combination of two or more such networks.

The client devices 306a, 306b may comprise, for example, a processor-based system such as a computer system. Such a computer system may be embodied in the form of a desktop computer, a laptop computer, a personal digital assistant, a mobile device (e.g. cellular telephone, smart phone, etc.), set-top box, music players, web pads, tablet computer systems, or other devices with like capability.

The client device 306a may be configured to execute various applications such as a browser application 353 and/or other applications. The browser application 353 may be executed in a client device 306a, for example, to access and render network pages 326, such as web pages, or other network content served up by the AMI operations system 103 and/or other servers. The client device 306a may be configured to execute applications beyond browser application 353 such as, for example, an email client for receiving email generated by the AMI application 115, instant message applications, an application specifically tailored to access resources of the AMI operations system 103, and/or other applications as can be appreciated. The client device 306a can include a display device 351 upon which various network pages 126 in which an administrative user interface can be rendered by the browser application 353. A client device 106b can also include a computing system on which an AMI client 361 tailored to interact with the UI module 121 and display a customized AMI client user interface 363. As one example, the AMI client 361 can include client side code that enhances a user experience by providing more complex user interface elements and other functionality and facilitates interaction with the UI module 121.

Figure 4:
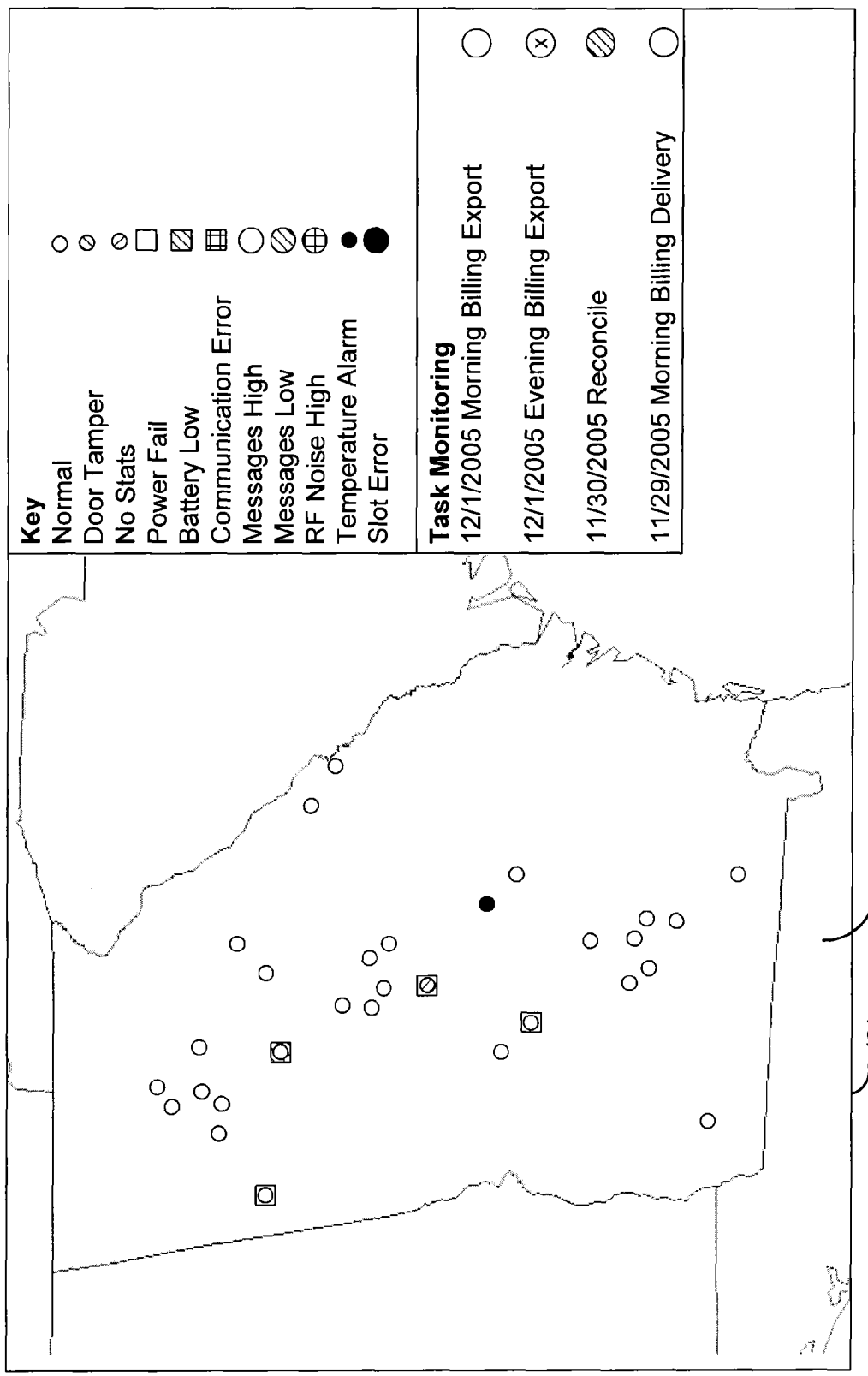
FIG. 4 is a drawing of an example of a user interface rendered by a client in the according to various embodiments of the present disclosure.

Reference is now made to FIG. 4, which illustrates one non-limiting example of an administrative user interface 401 that can be rendered on a client device 106a, 106b and that is facilitated by the UI module 121. The depicted administrative user interface 401 facilitates visualization of an AMI deployment by showing various status data associated with communications towers 105 and/or metering devices 107. In one embodiment, the UI module 121 can generate a status indicator in a map user interface element 403 that corresponds to the various communications towers 105 in a deployment. Because the location of a communications tower 105 can be known or ascertained, the UI module 121 can generate a status indicator that is overlaid on a location associated with each tower 105.

The UI module 121 can determine a status associated with a communications tower 105 by receiving statistics and/or alarms from the statistics module 123 and alarm monitor 117, respectively. In one embodiment, if statistics associated with a communications tower 105 are within a normal range that is specified by the statistics table 133 or elsewhere, and there are no alarms associated with the tower, the UI module 121 can generate a normal status indicator associated with the tower and overlay the indicator on the map in a location associated with the tower. Accordingly, if the status of a tower changes due to new statistics generated by the statistics module 123 or an alarm generated by the alarm monitor 117, the UI module can update a status indicator associated with the communications tower 105.

As shown in FIG. 4, the status indicator overlaid on the map user interface element 403 associated with a communications tower 105 can include a colored indicator and/or a shaped indicator that uniquely corresponds to the status associated with the communications towers 105 and/or metering devices 107 in an AMI deployment. Additionally, the administrative user interface 401 depicts task status indicators that depict a status associated with a task monitored by the task monitor 119. One methodology that can be employed to determine the status of a task by the task monitor 119 is described in further detail with reference to FIG. 6.

Figure 5:
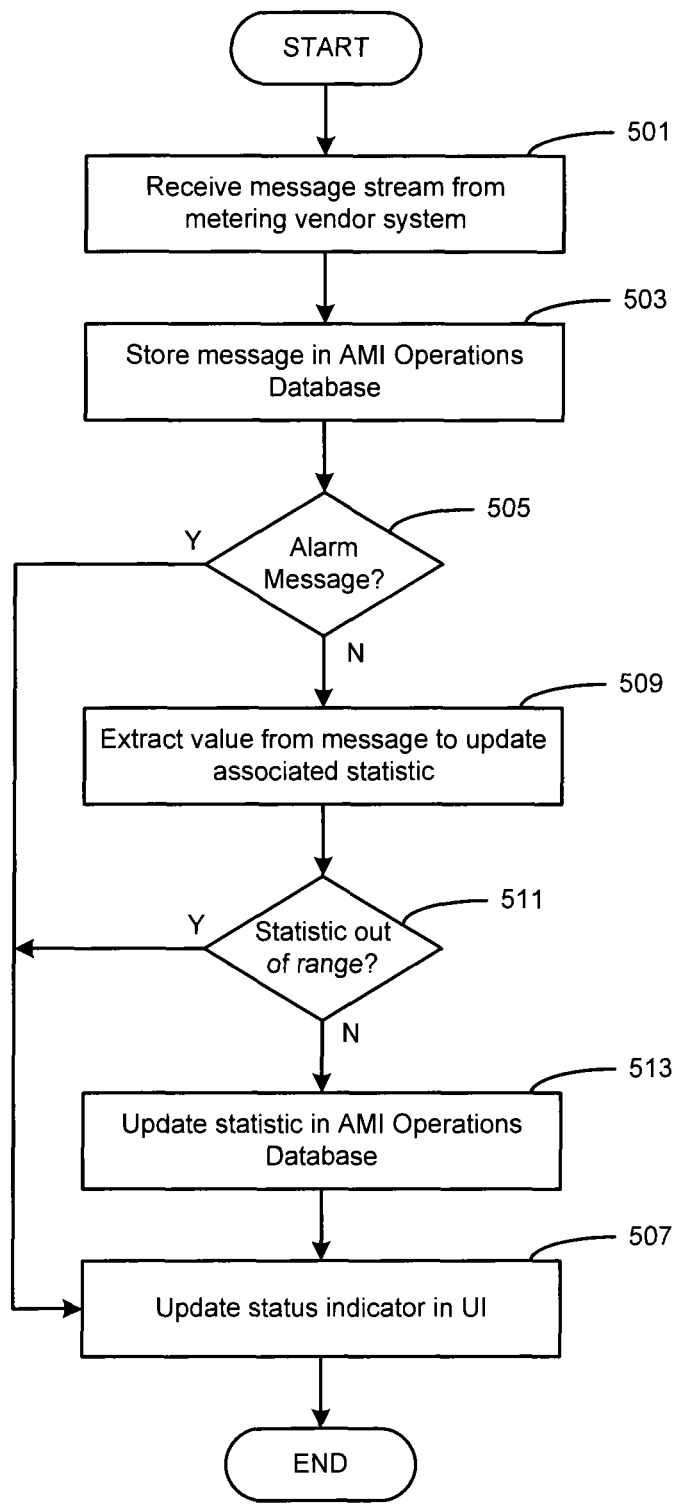
FIG. 5 is a flowchart illustrating one example of functionality implemented as portions of AMI application executed in the AMI operations system of FIG. 1 according to various embodiments of the present disclosure.
Figure 6:
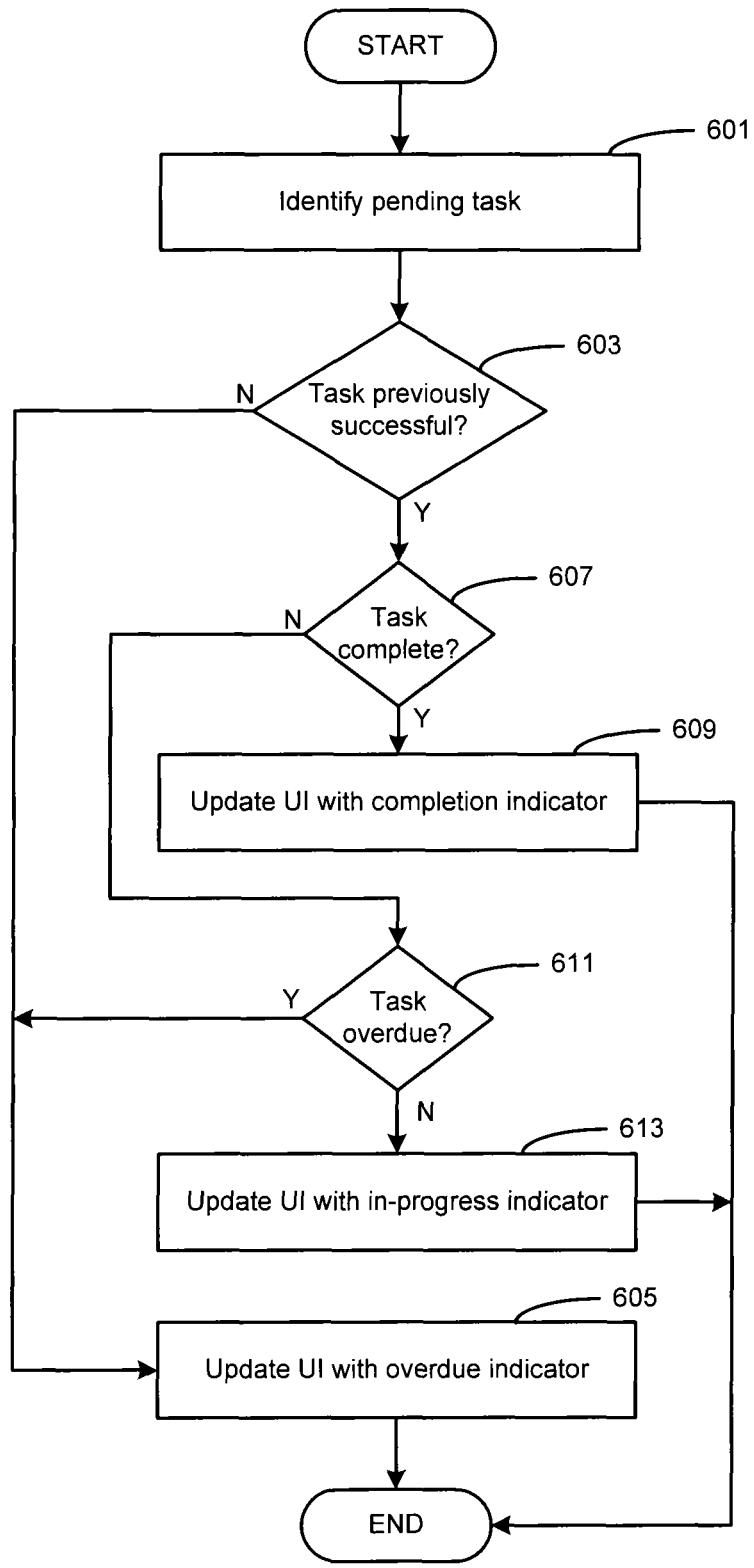
FIG. 6 is a flowchart illustrating one example of functionality implemented as portions of AMI application executed in the AMI operations system of FIG. 1 according to various embodiments of the present disclosure.

Referring next to FIG. 5-6, shown is a flowchart that provides one example of the operation of a portion of the AMI application 115 according to various embodiments. It is understood that the flowcharts of FIG. 5-6 provides non-limiting examples of the many different types of functional arrangements that may be employed to implement the operation of the portion of the AMI application 115 as described herein. As an alternative, the flowcharts of FIG. 5-6 may be viewed as depicting an examples of steps of a method implemented in the AMI operations system 103 (FIG. 1) according to one or more embodiments.

FIG. 5 depicts one example of the flow of messages in a message stream from a metering vendor system 109 to the AMI operations system 103 according to various embodiments of the disclosure. More specifically, FIG. 5 depicts one way in which messages and/or alarms transmitted by the metering vendor system 109 to the AMI operations system 103 are processed by the AMI application 115. To begin, in box 501, the AMI application 115 receives a message stream from the metering vendor system 109 and/or metering database 145. In box 503, the received message is stored in the AMI operations database 131.

In box 505, the AMI application 115 determines whether the received message is an alarm message that corresponds to a status indicator generated by the UI module 121. If so, in box 507 the status indicator in the administrative user interface is update accordingly. If not, in box 509, the AMI application 115 extracts a value from the message and determines its affect on a statistic with which the value is associated. For example, if the value extracted from the message is a signal strength value associated with a communications tower 105, then the AMI application 115, in box 511, determines whether the value, if taken into account to determine an average signal strength value in the statistics table 133, would cause the average signal strength to fall outside of predefined thresholds for an average signal strength. If so, the AMI application 115 updates a status indicator in the administrative user interface corresponding to average signal strength associated with the communications tower 105 to reflect that the average signal strength observed by the tower is outside an acceptable range. If the value does not cause the statistic to fall outside a predetermined threshold, then the AMI application 115, in box 513, updates the statistic in the statistics table 133.

Reference is now made to FIG. 6, which depicts one example of determining the status of tasks monitored by the task monitor 119 and displayed in an administrative user interface by the UI module 121 of the AMI application 115. To begin, in box 601, the AMI application 115 can identify a pending task defined in the AMI operations database 131. In box 603, the AMI application 115 can determined if the pending task was previously successfully completed. If not, then in box 605, the UI module 121 can update the status indicator associated with the task with an overdue indicator that indicates that the task is overdue. If the pending task has been previously successfully completed, then in box 607, the AMI application 115 determines whether a present iteration of the pending task has been completed. If so, then in box 609, the AMI application 115 updates a status indicator associated with the task in the administrative user interface with a completion indicator indicated that the task is complete.

If a present iteration of a pending task has not been completed, then in box 611, the AMI application 115 determines whether the task is overdue. If the task is not overdue, then in box 613, the AMI application updates a status indicator associated with the task in the administrative user interface with an in-progress indicator indicating that progress associated with the task has not yet reached a critical stage, as the task is not overdue. If the task is overdue, for which a due date can be specified by the task table 137, then the process proceeds to box 605, where the AMI application 115 updates the status indicator with an overdue indicator.

Figure 7:
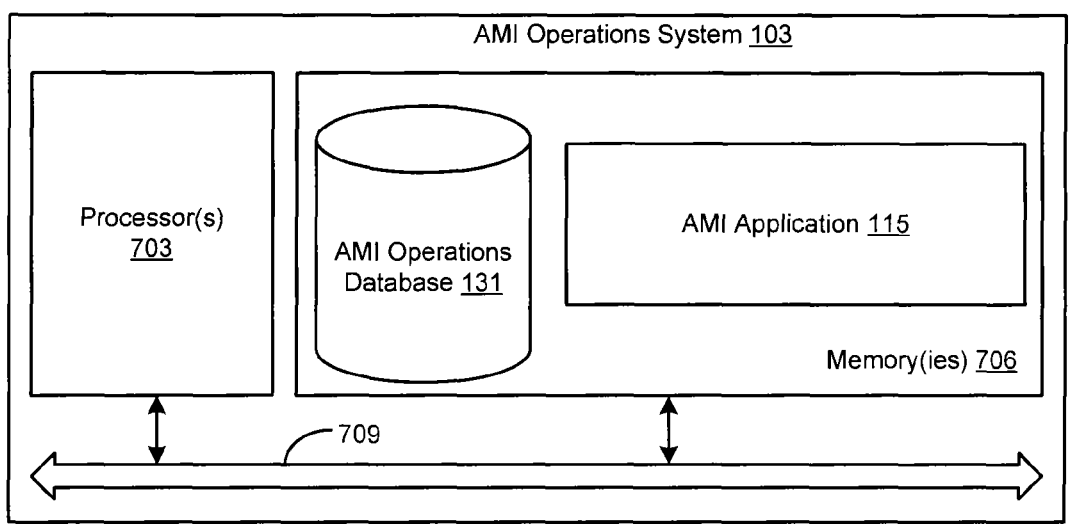
FIG. 7 is a schematic block diagram that provides one example illustration of an AMI operations system of FIG. 1 according to various embodiments of the present disclosure.

With reference to FIG. 7, shown is a schematic block diagram of the AMI operations system 103 according to an embodiment of the present disclosure. The AMI operations system 103 includes at least one processor circuit, for example, having a processor 703 and a memory 706, both of which are coupled to a local interface 709. To this end, the AMI operations system 103 may comprise, for example, at least one server computer or like device. The local interface 709 may comprise, for example, a data bus with an accompanying address/control bus or other bus structure as can be appreciated.

Stored in the memory 706 are both data and several components that are executable by the processor 703. In particular, stored in the memory 706 and executable by the processor 703 are the AMI application 115, and potentially other applications. Also stored in the memory 706 may be an AMI operations database 131 and other data. In addition, an operating system may be stored in the memory 706 and executable by the processor 703.

It is understood that there may be other applications that are stored in the memory 706 and are executable by the processors 703 as can be appreciated. Where any component discussed herein is implemented in the form of software, any one of a number of programming languages may be employed such as, for example, C, C++, C#, Objective C, Java, Javascript, Perl, PHP, Visual Basic, Python, Ruby, Delphi, Flash, or other programming languages.

A number of software components are stored in the memory 706 and are executable by the processor 703. In this respect, the term "executable" means a program file that is in a form that can ultimately be run by the processor 703. Examples of executable programs may be, for example, a compiled program that can be translated into machine code in a format that can be loaded into a random access portion of the memory 706 and run by the processor 703, source code that may be expressed in proper format such as object code that is capable of being loaded into a random access portion of the memory 706 and executed by the processor 703, or source code that may be interpreted by another executable program to generate instructions in a random access portion of the memory 706 to be executed by the processor 703, etc. An executable program may be stored in any portion or component of the memory 706 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

The memory 706 is defined herein as including both volatile and nonvolatile memory and data storage components. Volatile components are those that do not retain data values upon loss of power. Nonvolatile components are those that retain data upon a loss of power. Thus, the memory 706 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

Also, the processor 703 may represent multiple processors 703 and the memory 706 may represent multiple memories 706 that operate in parallel processing circuits, respectively. In such a case, the local interface 709 may be an appropriate network that facilitates communication between any two of the multiple processors 703, between any processor 703 and any of the memories 706, or between any two of the memories 706, etc. The local interface 709 may comprise additional systems designed to coordinate this communication, including, for example, performing load balancing. The processor 703 may be of electrical or of some other available construction.

Although the AMI application 115 and other various systems described herein may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits having appropriate logic gates, or other components, etc. Such technologies are generally well known by those skilled in the art and, consequently, are not described in detail herein.

The flowcharts of FIGS. 5-6 show the functionality and operation of an implementation of portions of the AMI application 115. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor 703 in a computer system or other system. The machine code may be converted from the source code, etc. If embodied in hardware, each block may represent a circuit or a number of interconnected circuits to implement the specified logical function(s).

Although the flowcharts of FIGS. 5 and 6 show a specific order of execution, it is understood that the order of execution may differ from that which is depicted. For example, the order of execution of two or more blocks may be scrambled relative to the order shown. Also, two or more blocks shown in succession in FIGS. 5 and 6 may be executed concurrently or with partial concurrence. Further, in some embodiments, one or more of the blocks shown in FIGS. 5 and 6 may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein, including in the AMI application 115, that comprises software or code can be embodied in any non-transitory computer-readable medium for use by or in connection with an instruction execution system such as, for example, a processor 703 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system. The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, the following is claimed:

1. A system, comprising:
   at least one computing device; and
   an advanced metering infrastructure (AMI) application executable in the at least one computing device, the AMI application comprising:
   logic that receives a metering data stream from a metering database, the metering data stream comprising a plurality of messages regarding a plurality of communications towers and a plurality of metering devices in an AMI deployment;
   logic that stores the plurality of messages in an AMI operations database;
   logic that extracts from one of the plurality of messages a value associated with one of a plurality of statistics associated with the AMI deployment;
   logic that determines a status of the plurality of communications towers and the plurality of metering devices based at least upon the value further associated with the one of the plurality of messages and data retrieved from the AMI operations database, wherein the status of the plurality of communications towers and the plurality of metering devices comprises: a normal status, a door tamper status, a power failure status, a slot error status, a low battery status, a communication error status, a temperature error status, a message overload status, a low message status, and an insufficient statistics status, wherein the low battery status generates a low battery alarm when a backup battery associated with one of the plurality of communications towers is lower than a threshold battery level, wherein the door tamper status generates a door tamper alarm when the one of the plurality of communications towers detects unauthorized entry or tampering;
   logic that updates the plurality of statistics associated with the AMI deployment based at least in part upon the status of the plurality of communications towers and the plurality of metering devices;
   logic that renders a user interface displaying a status indicator associated with the status of the plurality of communications towers and the plurality of metering devices;
   logic that determines whether the value causes the one of the plurality of statistics to fall outside of at least one predetermined threshold;
   logic that updates the status indicator and generates an alarm when the value causes the one of the plurality of statistics to fall outside of the at least one predetermined threshold; and
   logic that, in response to the value not causing the one of the plurality of statistics to fall outside of the at least one predetermined threshold, updates the one of the plurality of statistics in the AMI operations database.

2. The system of claim 1, further comprising:
   logic that determines a location associated with the one of the plurality of communications towers and one of the plurality of metering devices;
   logic that renders the user interface displaying the status indicator associated with a location indicator associated with the location; and
   logic that updates the status indicator when the status of the plurality of communications towers and the plurality of metering devices changes.

3. The system of claim 2, wherein the status indicator comprises at least one of: a colored indicator and a shaped indicator.

4. The system of claim 2, further comprising:
   logic that monitors at least one task associated with the AMI deployment; and
   logic that updates the user interface with a task status indicator corresponding to the at least one task.

5. The system of claim 4, wherein the task status indicator further comprises at least one of: a completion indicator, an overdue indicator, or an in-progress indicator.

6. The system of claim 4, wherein the logic that monitors the at least one task comprises:
   logic that determines a completion progress of a task;

logic that determines an expected completion time for the task;

logic that determines a task deadline associated with the task; and the logic that determines the completion progress of the task and the logic that determines the expected completion time for the task, whether the task will be completed by the task deadline.

7. The system of claim 6, wherein the task comprises at least one of: a request to retrieve usage data associated with a plurality of metering devices in the AMI deployment, a request to reconcile requested usage data and reported usage data associated with the plurality of metering devices in the AMI deployment, and a request to report the usage data associated with the plurality of metering devices in the AMI deployment.

8. The system of claim 4, wherein the at least one task comprises determining whether a retrieval of usage data associated with the plurality of metering devices in the AMI deployment is complete.

9. The system of claim 2, wherein the logic that renders the user interface displaying the status indicator associated with the location indicator associated with the location comprises logic that overlays the status indicator on a map interface, the status indicator placed on a map location corresponding to the location associated with the one of the plurality of communications towers and one of the plurality of metering devices.

10. The system of claim 1, wherein the logic that determines the status of the plurality of communications towers and the plurality of metering devices based at least upon the value further associated with the one of the plurality of messages and the data retrieved from the AMI operations database comprises logic that retrieves a metering alarm message from the metering data stream.

11. The system of claim 1, wherein the logic that determines the status associated with the plurality of communications towers and the plurality of metering devices based at least upon the value further associated with the one of the plurality of messages and the data retrieved from the AMI operations database comprises logic that retrieves a metering alarm message from the metering data stream.

12. The system of claim 1, wherein the temperature error status generates a temperature sensor alarm when a temperature sensor associated with the one of the plurality of communications towers detects a temperature outside of a predefined threshold, wherein the communication error status generates the alarm when the one of the plurality of communications towers communicates with the metering database.

13. The system of claim 1, wherein the plurality of statistics comprises an average number of messages per hour received, a number of messages received per a frequency slot, and a number of peer-to-peer messages.

14. A method, comprising:

receiving, in at least one computing device, a metering data stream from a metering database, the metering data stream comprising a plurality of messages regarding a plurality of communications towers and a plurality of metering devices in an advanced metering infrastructure (AMI) deployment;

storing, via the at least one computing device, the plurality of messages in an AMI operations database;

extracting, via the at least one computing device, from one of the plurality of messages a value associated with one of a plurality of statistics associated with the AMI deployment;

determining, via the at least one computing device, a status of the plurality of communications towers and the plurality of metering devices based at least upon the value further associated with the one of the plurality of messages and data retrieved from the AMI operations database, wherein the status of the plurality of communications towers and the plurality of metering devices comprises: a normal status, a door tamper status, a power failure status, a slot error status, a low battery status, a communication error status, a temperature error status, a message overload status, a low message status, and an insufficient statistics status, wherein the low battery status generates a low battery alarm when a backup battery associated with one of the plurality of communications towers is lower than a threshold battery level;

updating, via the at least one computing device, the plurality of statistics associated with the AMI deployment based at least in part upon the status of the plurality of communications towers and the plurality of metering devices;

rendering, via the at least one computing device, a user interface, wherein the user interface displaying a status indicator associated with the status of the plurality of communications towers and the plurality of metering devices;

determining, via the at least one computing device, whether the value causes the one of the plurality of statistics to fall outside of at least one predetermined threshold; and updating, via the at least one computing device, the status indicator when the value causes the one of the plurality of statistics to fall outside of the at least one predetermined threshold; and updating, via the at least one computing device, in response to the value not causing the one of the plurality of statistics to fall outside of the at least one predetermined threshold, the one of the plurality of statistics in the AMI operations database.

15. The method of claim 14, further comprising:

determining, via the at least one computing device, a location associated with the one of the plurality of communications towers and one of the plurality of metering devices;

rendering, via the at least one computing device, the user interface, wherein the user interface comprising displaying the status indicator associated with the status of the plurality of communications towers and the plurality of metering devices and a location indicator associated with the location; and updating, via the at least one computing device, the status indicator when the status of the plurality of communications towers and the plurality of metering devices changes.

16. The method of claim 15, further comprising:

monitoring, via the at least one computing device, at least one task associated with the AMI deployment; and updating, via the at least one computing device, the user interface with a task status indicator corresponding to the at least one task.

17. The method of claim 16, wherein the task status indicator comprises at least one of: a completion indicator, an overdue indicator, or an in-progress indicator.

18. The method of claim 16, wherein said monitoring the at least one task comprises:

determining, via the at least one computing device, completion progress of a task;

determining, via the at least one computing device, an expected completion time for the task;

determining, via the at least one computing device, a task deadline associated with the task; and said determining, via the at least one computing device, the completion progress of the task and said determining, via the at least one computing device the expected completion time of the task, whether the task will be completed by the task deadline.

19. The method of claim 18, wherein the task comprises at least one of: a request to retrieve usage data associated with the plurality of metering devices in the AMI deployment, a request to reconcile requested usage data and reported usage data associated with the plurality of metering devices in the AMI deployment, and a request to report the usage data associated with the plurality of metering devices in the AMI deployment.

20. The method of claim 16, wherein the at least one task comprises determining usage data regarding the plurality of metering devices in the AMI deployment.

21. The method of claim 15, wherein said rendering the user interface comprises overlaying, via the at least one computing device, the status indicator on a map interface, the status indicator placed on a map location corresponding to the location associated with the one of the plurality of communications towers and the one of the plurality of metering devices.

22. The method of claim 14, wherein the status indicator comprises at least one of:
a colored indicator and a shaped indicator.

23. The method of claim 14, wherein said determining, via the at least one computing device, the status of the plurality of communications towers and the plurality of metering devices based at least upon the value further associated with the one of the plurality of messages and the data retrieved from the AMI operations database comprises logic that retrieves a metering alarm message from the metering data stream.

24. The method of claim 14, wherein said determining, via the at least one computing device, the status associated with the plurality of communications towers and the plurality of metering devices based at least upon the value further associated with the one of the plurality of messages and the data retrieved from the AMI operations database comprises logic that retrieves a metering alarm message from the metering data stream.

* * * * *